United States Patent [19]
Carney et al.

[11] Patent Number: 5,748,453
[45] Date of Patent: May 5, 1998

[54] PCI EXPANSION CARD SLIDE-TYPE RETAINER

[75] Inventors: James M. Carney, Pepperell; Dave Desilets, Hopkinton, both of Mass.; Clifford Willis, Tracy; Alan Lee Winick, San Jose, both of Calif.; Christopher E. Chiodo, Andover, Mass.

[73] Assignee: Sun Microsystems, Inc., Mountain View, Calif.

[21] Appl. No.: 674,127

[22] Filed: Jul. 1, 1996

[51] Int. Cl.⁶ .................................. H05K 7/14

[52] U.S. Cl. .................. 361/801; 361/683; 361/684; 361/686; 361/747; 361/759; 361/800; 211/411

[58] Field of Search .................. 361/600, 679, 361/683–684, 685, 686, 796, 797, 800, 818, 747, 759, 801; 174/35 R; 312/223.2, 223.1, 216, 293.3; 211/26, 41; 292/102, 107; 439/61; 206/273

[56] References Cited

U.S. PATENT DOCUMENTS

| | | | |
|---|---|---|---|
| 4,768,652 | 9/1988 | Fallon | 206/373 |
| 5,601,349 | 2/1997 | Holt | 312/265.6 |

*Primary Examiner*—Leo P. Picard
*Assistant Examiner*—Phuong T. Vu
*Attorney, Agent, or Firm*—Julian Caplan; Flehr Hohbach Test; Albritton & Herbert LLP

[57] ABSTRACT

Computers are manufactured with connectors in which are inserted at least one PCI expansion card to increase the capacity of the computer. A computer enclosure panel is formed with an opening for insertion and withdrawal of the card. The card has a cover which blocks the opening after the card has been plugged in. The invention provides a retainer mounted on the rear panel which, when projected, engages the cover to assist in holding the card in place. The slide has a detent which is manually disengaged in order to slide the cover to retracted position. It further provides room for the tab conventionally extending outward of the card so that the card may be located closer to the side panel, thereby conserving space within the enclosure. Computers as shipped from the factory many times are not provided with PCI cards and the opening is blocked by a removable blanking cover. The slide also holds the blanking cover in position.

28 Claims, 7 Drawing Sheets

PCI EXPANSION CARD SLIDE-TYPE RETAINER

BACKGROUND OF THE INVENTION

1. Field of the Invention

This invention relates to a new and improved PCI expansion card slide-type retainer. More particularly, the invention relates to a retainer which engages a cover fixed to such card, retaining the cover in place blocking an opening formed in a wall of the computer enclosure.

2. Description of Related Art

PCI cards conventionally have been sold with a vertical cover or plate along one edge having an outward extending tab. When the card is plugged into pin connectors inside the computer enclosure, the cover blocks an I/O opening in the wall of the casing. Conventionally a screw has been used to attach a tab on the cover to a bracket on the enclosure. The present invention provides a retainer for the cover which does not require use of such a screw or equivalent fastener.

SUMMARY OF THE INVENTION

The present invention comprises a retainer attached to a panel of a computer enclosure which is movable between open and closed positions. In open position a conventional PCI card or a blanking cover (used when no card is installed) may be installed or removed. When the slide is closed the card or blanking cover is secured in place. Use of the cover shields against EMI and dust and is a safety precaution. More particularly, the present invention employs as its retainer a slide which slides parallel to the panel and is detachably latched in closed position so that it cannot unintentionally be opened and cannot be opened from the outside.

As has been explained, heretofore a screw has been used to attach a tab extending outwardly of the cover to a bracket on the computer enclosure. Attaching and detaching such screws requires considerable manual dexterity and is time consuming. Furthermore, frequently the screw falls into the enclosure and is difficult to find and remove. Such problems are avoided by use of this invention.

Another feature of the invention is that heretofore the outer end of the tab attached to the plate has been connected to the computer enclosure panel, which requires that the edge of the card be spaced from the panel a distance approximately equal to the length of the tab (which for practical purposes is approximately ½"). The present invention enables the card to be located closer to the panel, the tab projecting outwardly of the housing and thereby making more of the space within the enclosure usable. The present invention provides better access for connectors (e.g., for printers) and for the retention screws which conventionally hold such connectors in place because the card edge is closer to the enclosure panel.

A further feature of the invention is that conventionally there are two openings in the panel of the computer enclosure to accommodate two separate cards and the slide of the present invention retains the covers for both openings. Where only one or no card is used, blocking covers are used and the present invention can retain both a card cover and a blocking cover, two card covers or two blanking covers.

A hole is usually formed in the panel adjacent the I/O openings. The retainer of the present invention has means for covering this hole as the retainer is moved to closed position.

The present invention provides means for attaching the retainer to the panel of the enclosure firmly on all axes.

Another feature of the invention is the ease which the user may move the slide between open and closed positions.

A detent is employed to hold the retainer in closed position. A finger grip is attached which performs the functions of engaging and disengaging the detent and also of sliding the retainer between open and closed positions. The finger grip is attached to a spring which normally biases the detent out of engagement and other means are used to retain the detent in operative position. By bending the finger grip against the spring force, the detent is disengaged and after being disengaged the retainer may be slid either to open positions.

The mechanism of the present invention is actuated with the cover of the enclosure off, inasmuch as the finger grip is disengageable only from the inside of the enclosure. Hence, any lock which is embodied for the enclosure cover improves the security of the device.

BRIEF DESCRIPTION OF THE DRAWINGS

The accompanying drawings, which are incorporated in and form a part of this specification, illustrate embodiments of the invention and, together with the description serve to explain the principles of the invention.

FIG. 2 is an enlarged perspective view of a portion of the structure of FIG. 1. In FIGS. 1 and 2, no PCI card is installed, but the openings in the enclosure therefor are closed by removable blanking covers.

DETAILED DESCRIPTION OF THE PREFERRED EMBODIMENT

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

Figure 1:
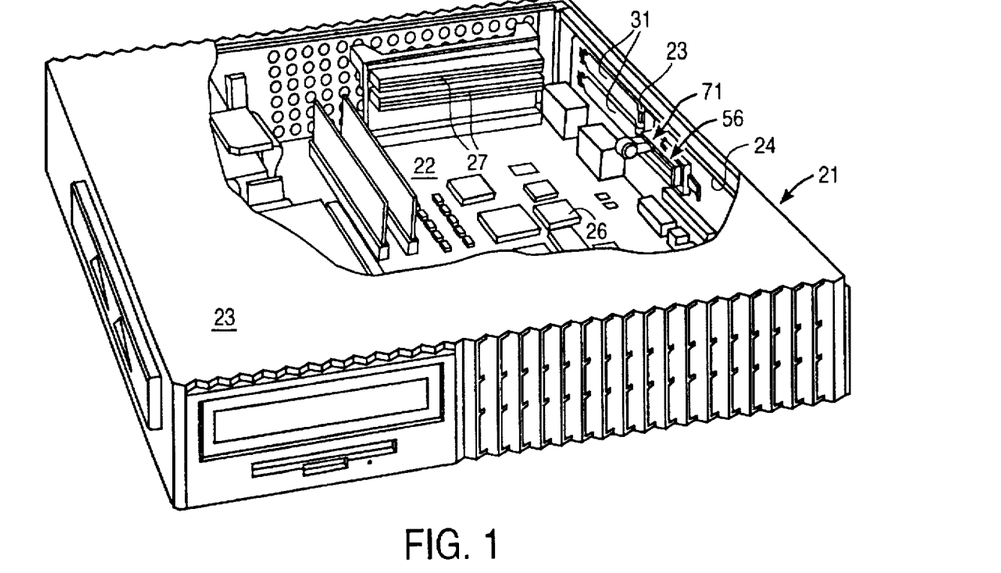
FIG. 1 is a perspective view of a computer enclosure with the cover broken away to reveal internal construction.
Figure 2:
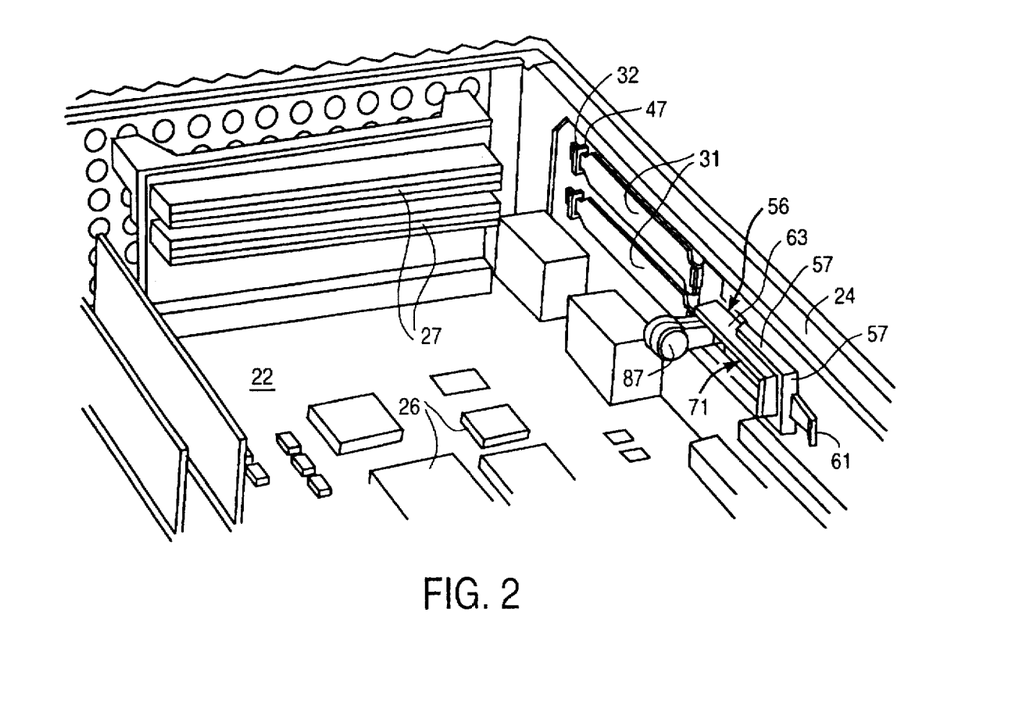

Enclosure 21 has a bottom 22 and top 23 and at least one vertical panel 24 here shown as the rear panel. Various electronic components may be installed on bottom 22. Adjacent rear panel 24 are two horizontally spaced apart connectors 27 of a type well known in the industry. The PCI cards 36 hereinafter described are plugged into the connectors 27. However, as shown in FIGS. 1 and 2, no cards are installed. Accordingly, blanking covers 31 are used to close off openings 46 in panel 24, there being two such covers 31 shown, each having a tongue 32 at one end and an outwardly protruding tab 33 of the opposite end. Tab 33 is formed with a notch 34 which is external to the casing 21 (not shown in FIGS. 1 and 2) and used heretofore to attach the cover to a bracket by use of a screw (not shown). The present invention makes use of such a screw unnecessary.

Figure 3:
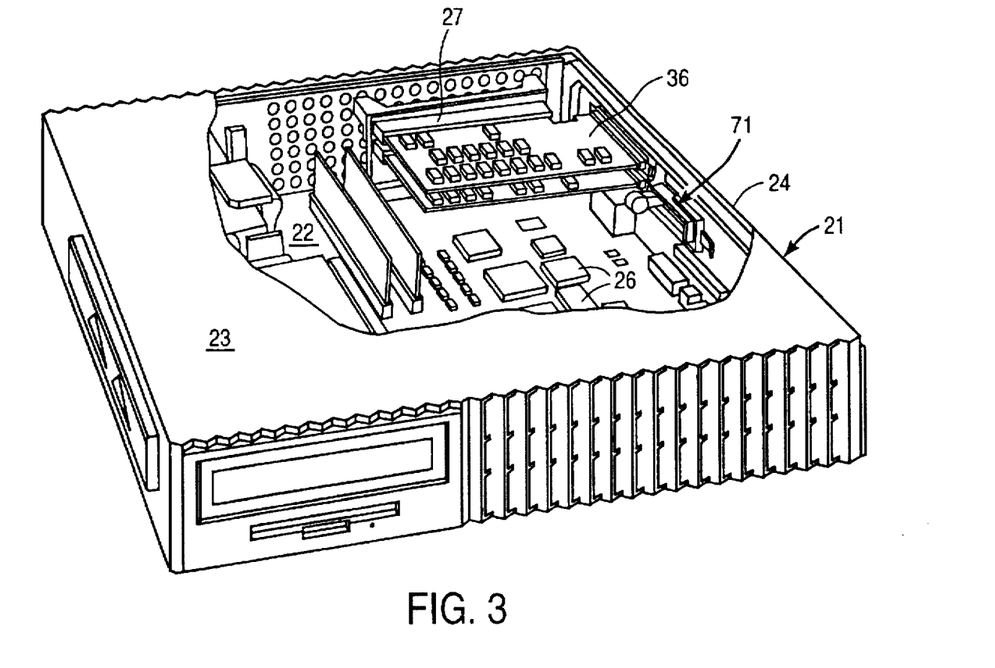
FIG. 3 is a view similar to FIG. 1 showing PCI cards installed.
Figure 4:
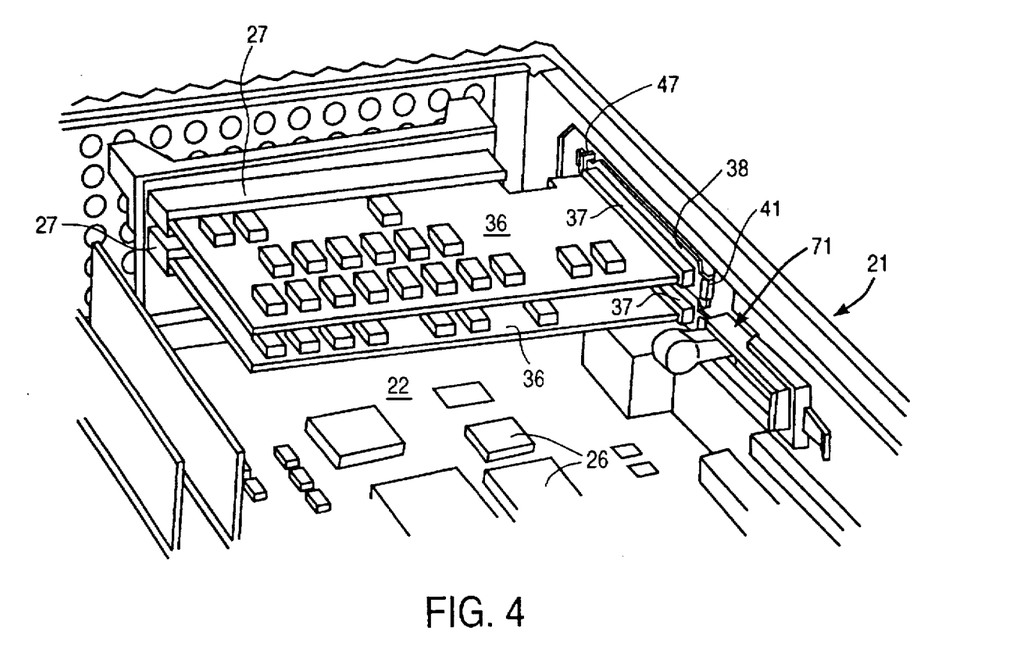
FIG. 4 is an enlarged perspective view of a portion of FIG. 3.
Figure 5:
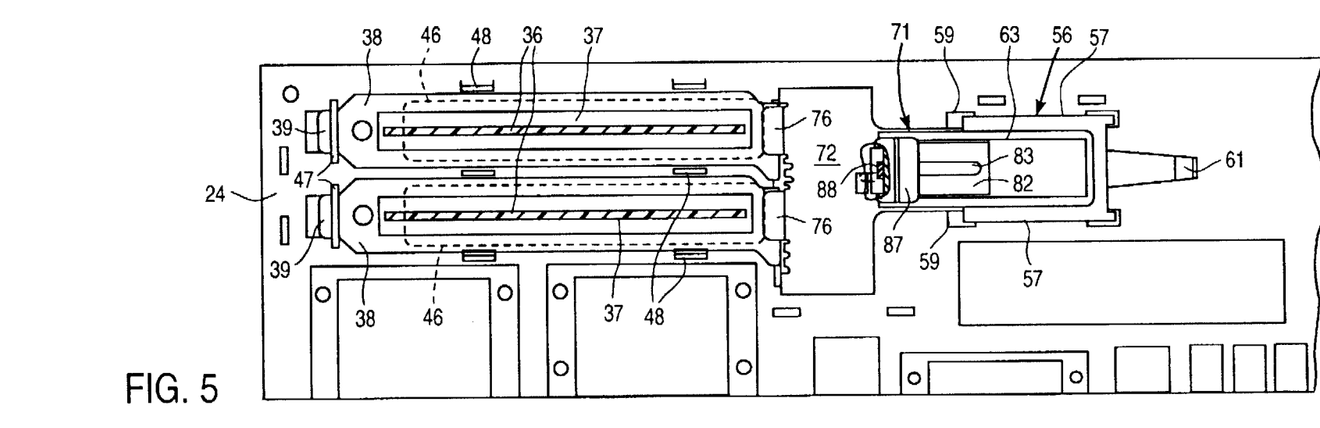
FIG. 5 is an enlarged side elevational view of a portion of the panel of the computer construction showing cards installed.
Figure 6:
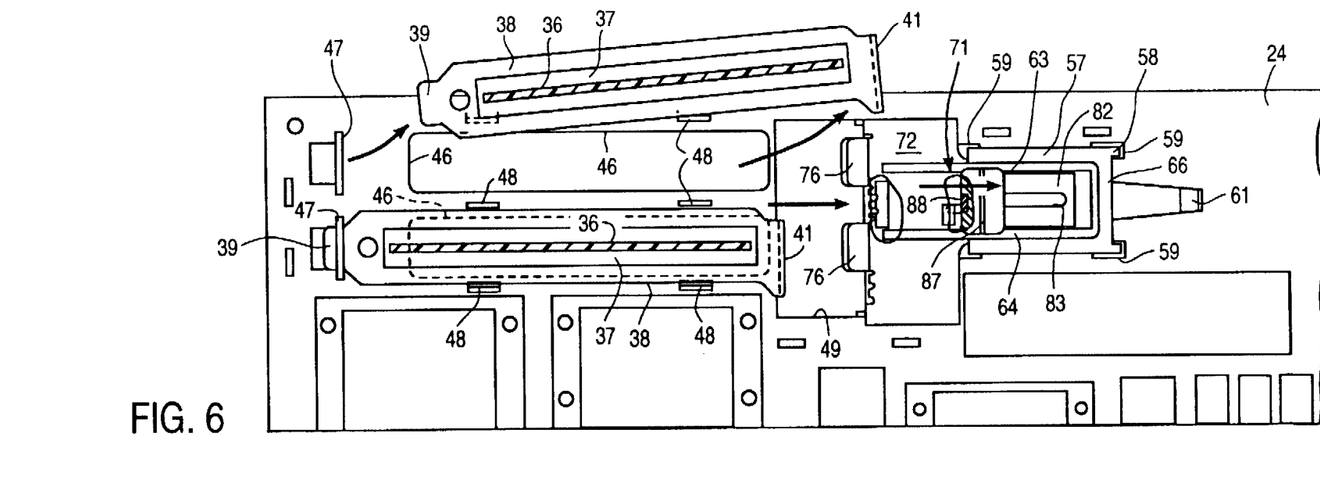
FIG. 6 is a view similar to FIG. 5 showing one of the PCI cards in the process of being removed.
Figure 8:
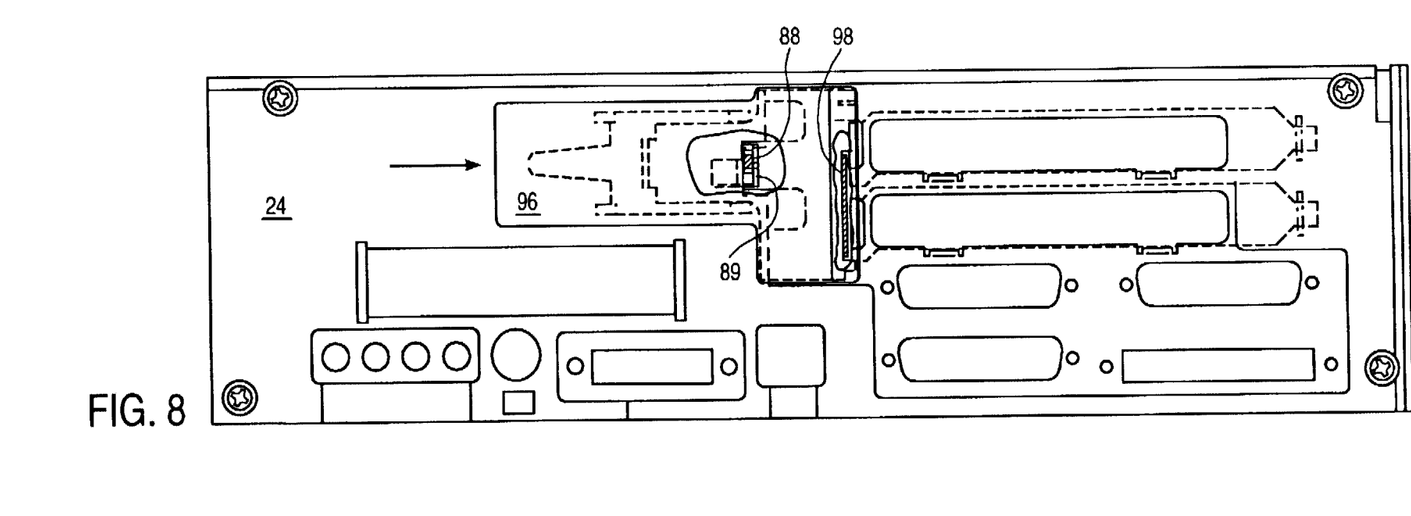
FIG. 8 is a view similar to FIG. 7 showing the retainer closed.
Figure 9:
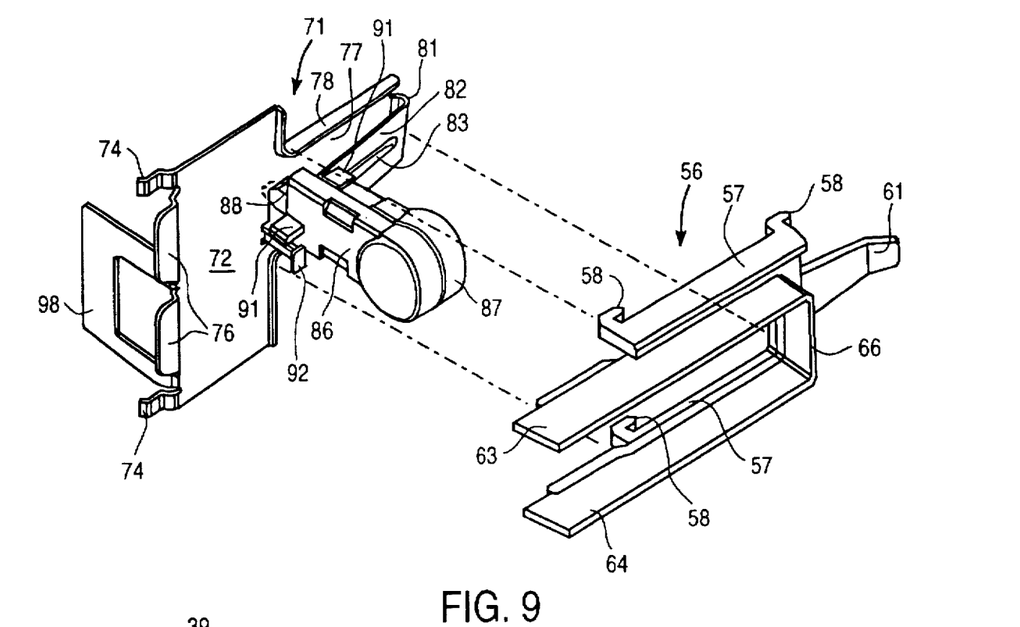
FIG. 9 is an enlarged perspective view showing portions of the retainer.
Figure 10:
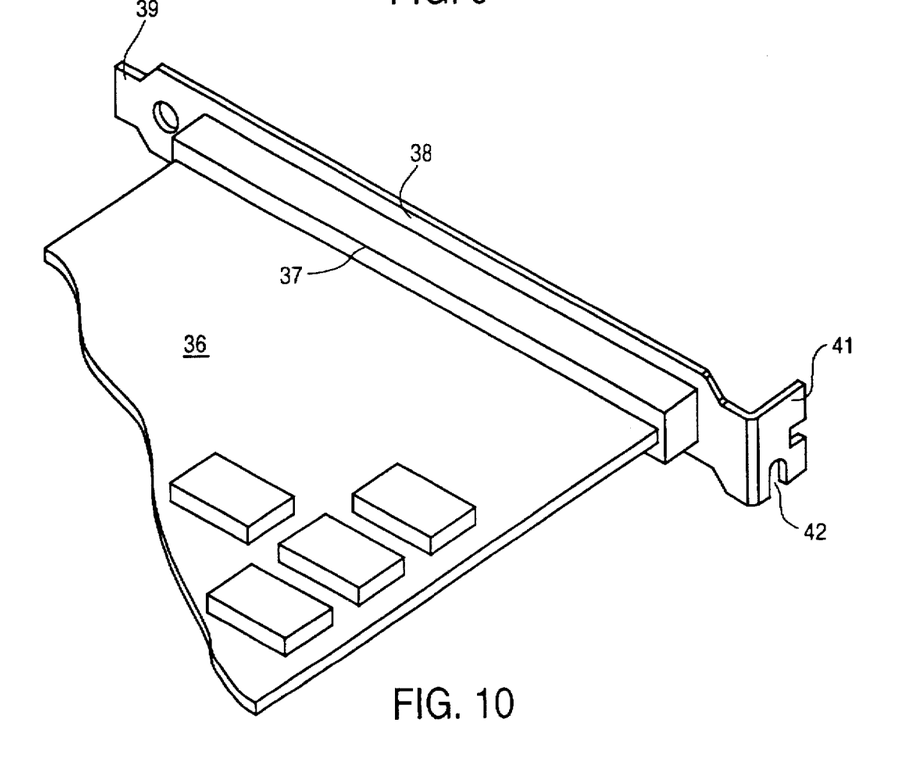
FIG. 10 is an enlarged sectional view showing a portion of a PCI card.
Figure 11:
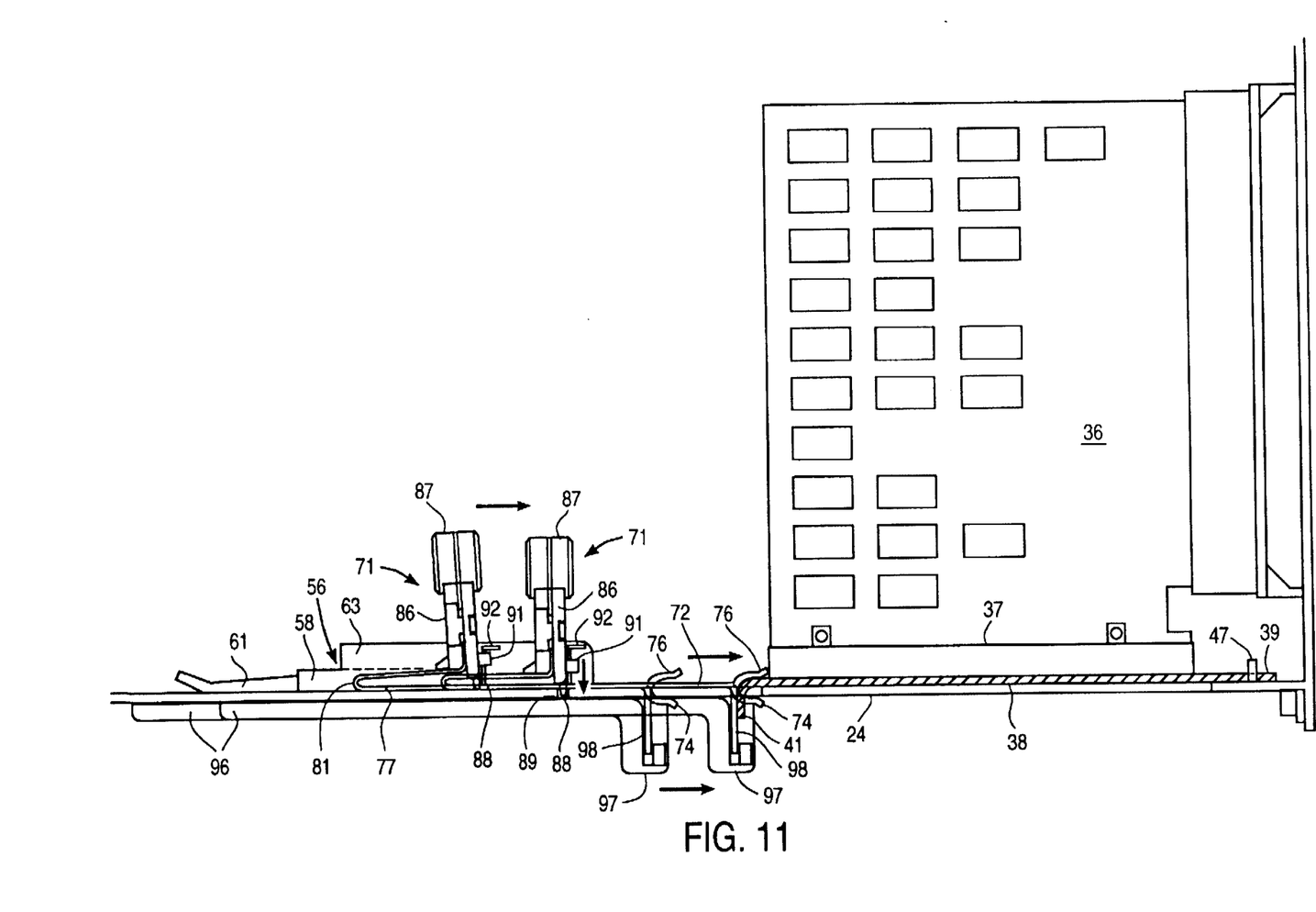
FIG. 11 is a top plan view of the structure of FIG. 6.

Directing attention now to FIGS. 3 and 4, PCI card 36 is of a type well known in the industry. A typical card is illustrated and described in *PCI Local Bus Specification, Rev. 2.0, Chapter 5: Mechanical Specification*, published by PCE Special Interest Group of Hillsboro, Oreg. As illustrated, there are two horizontally spaced apart cards 36 employed, one longitudinal edge of each being connected to one of the connectors 27. A lateral edge of card 36 is formed with an edge reinforcement 37 and externally thereof is a metallic cover 38. Cover 38 has an extending tongue 39 at one end and a laterally outwardly bent tab 41 at its opposite end formed with a notch 42 (see FIG. 8). In prior practice, a screw (not shown) is used to connect the cover 38 to a bracket (also not shown) on the interior of panel 24. The present invention eliminates the necessity for use of the screw or similar means of attachment.

Elongated rectangular openings 46 are formed in panel 24 of a length slightly greater than the distance required to disconnect the contacts (not shown) on card 36 from connectors 27. Where no PCI card is used, blanking covers 31 are used to close such openings and when cards 36 are used, the covers 38 close such openings. Adjacent one end of opening 46 is a tongue receptor 47 fixed to panel 24 which receives tongue 39 and holds it in place. Inward projecting cover edge guides 48 are positioned above and below the longitudinal edges of openings 46 to engage the top and bottom edges of cover 38 (or 31). Rearward of openings 46 is vertically elongated rectangular opening 49 through which tab 41 protrudes.

Figure 12:
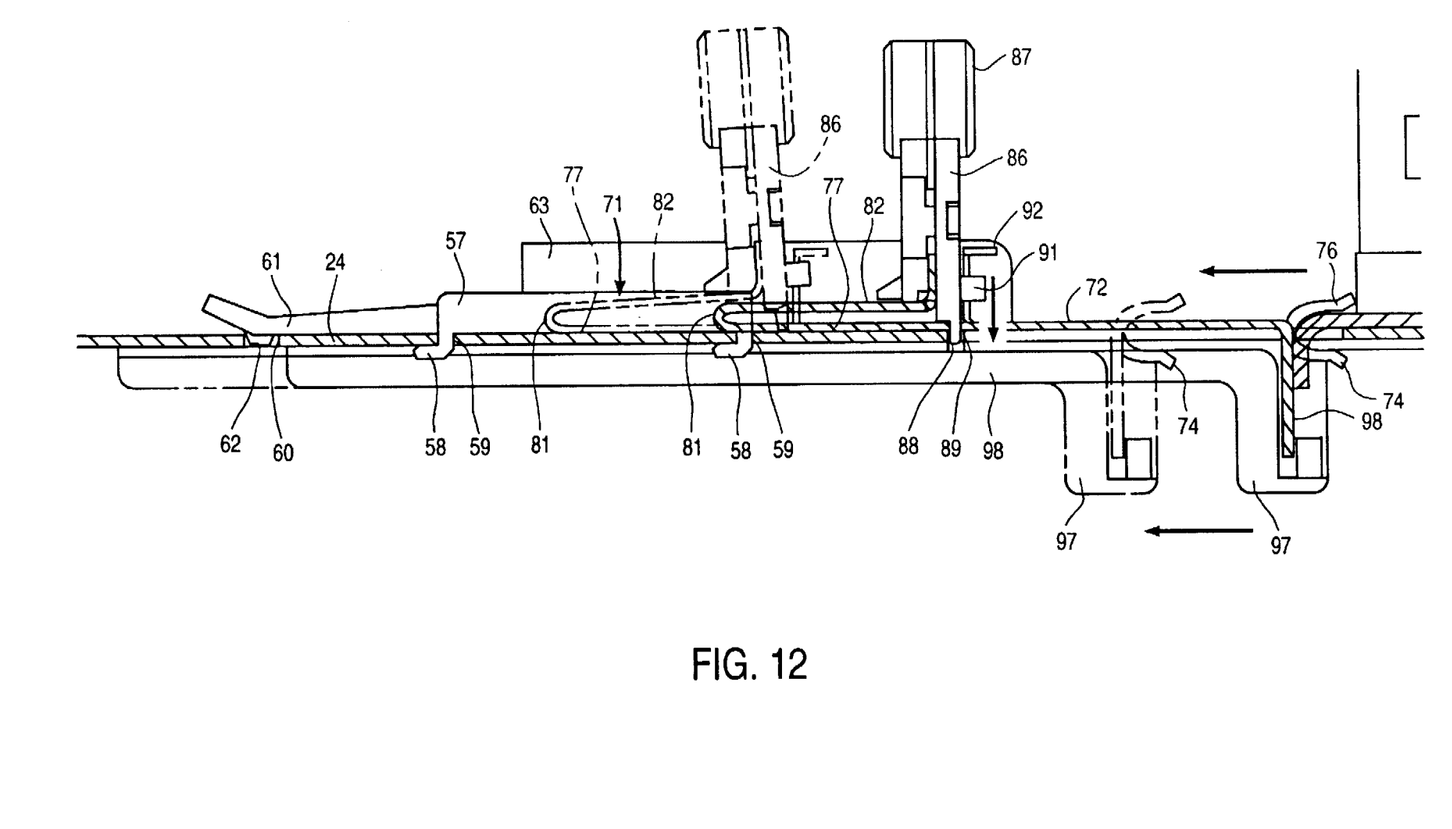
FIG. 12 is a sectional view taken substantially along line 12—12 of FIG. 7.

Retainer track 56 attached to the inside of panel 24 consists of top and bottom attachment members 57 having hooks 58 on their outer edges which fit into holes 59 in panel 24 to hold the track 56 in place when slid to the left as viewed in FIG. 12. Longitudinally extending lever 61 has a detent 62 on its outside which fits into hole 60 in panel 24. Detent 62 prevents hooks 62 from being disengaged from holes 59. If lever 61 is pulled inwardly from the inside of the enclosure 21, detent 62 may be disengaged from hole 60 and then hooks 58 may be disengaged from holes 59 by sliding to the right as viewed in FIG. 12. Fixed between attachment members 57 are top rail 63 and bottom rail 64 vertically spaced apart and parallel. The tracks 56 and rails 63, 64 are held in place by connector 66.

Figure 7:
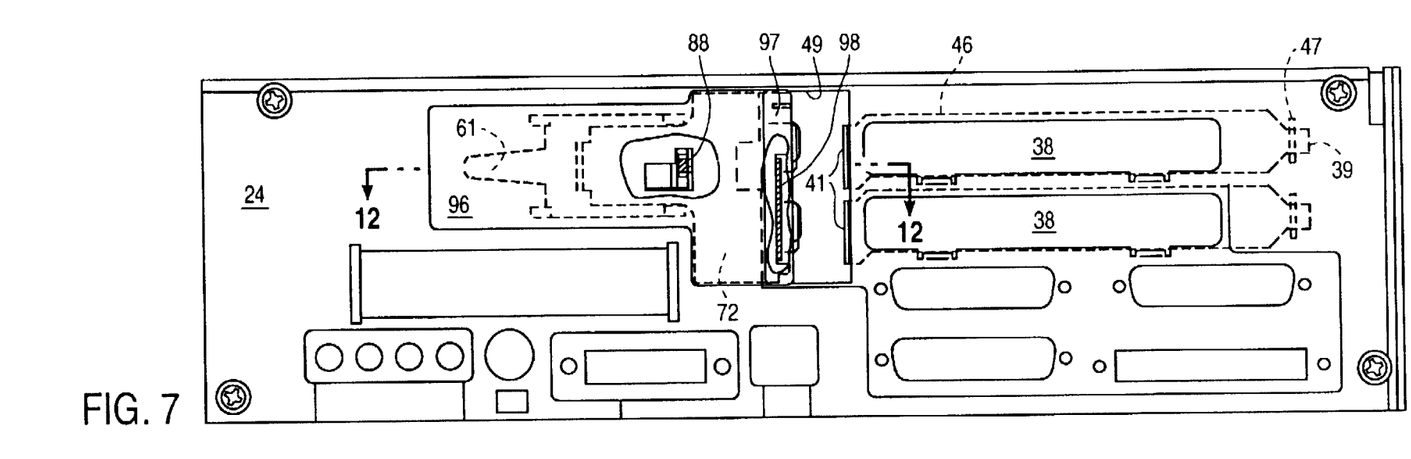
FIG. 7 is a side elevational view of the exterior showing the retainer open.

Horizontally slidable between rails 63, 64 is slide 71 which has a blanking portion 72 which in the closed position of slide 71 closes off opening 49. On the vertical leading edge of blanking portion 71 are top and bottom outer fingers 74 and top and bottom inner fingers 76. Outer fingers 74 engage the outside of panel 24 beyond the edge of opening 49 while the inner fingers 76 in the closed position of the slide 71 engage cover 38 (or 31). Extension 77 extends from portion 72 in a direction opposite fingers 74, 76 and has top and bottom rail engager 78 which engage top and bottom rails 63, 64. The distal end of extension 76 is formed with an approximately 180° bend 81 which connects to spring 82 disposed at an angle to extension 77 and formed with a stiffener rib 83. Extending inwardly from the end of spring 82 opposite bend 81 is arm 86 having a finger grip 87. On the end of arm 86 opposite grip 87 is a detent 88 which fits into a socket 89 formed in panel 24 to secure the detent in closed position of slide 71 (see FIG. 8). Further, as best shown in FIG. 7, ears 91 projecting outwardly of arm 86 are engaged by stop 92 which limits outward movement of detent 88 beyond what is necessary to disengage the detent from socket 89.

For cosmetic purposes, to conceal openings in panel 24 and prevent removal of slide 71 from the outside, a horizontally slidable plate 96 is used. Such plate 96 is provided with an outward extending handle 97 which may be used to close (but not to open) slide 71 from the outside. Plate 96 is connected to slide 71 by apertured tab 98 bent outwardly of blanking portion 72 of slide 71.

Ordinarily, computers shipped from the factory do not have cards 36 installed therein because the needs of customers for such cards vary. Accordingly, blanking covers 31 are installed as shown in FIGS. 1 and 2 and the slide 71 in closed position secures the covers 31 in place. In order to remove covers 31 with top 23 open, the user reaches inside the enclosure to grip 87, pull inwardly until ear 91 engages stop 92 and detent 88 is disengaged from socket 89. The grip 87 is moved to open position (remote from openings 46). Thereupon one or both covers 31 may be removed.

To install a card 36, the user plugs it into one of the connectors 27 and at the same time, tongue 39 is inserted into receptor 47. Tab 41 extends outwardly of panel 24. Thereupon the user slides grip 87 or handle 97 to close slide 71 and fingers 87 fit out through opening 49 to engage the outside of panel 24 while the fingers 76 engage the plate 38 adjacent the location of tab 41. Plate 96 closes of openings in panel 24. When slider 71 is in closed position, detent 88 drops into its socket 89 in panel 24. Accordingly, the card 36 is firmly held in place.

What is claimed is:

1. A retainer for retaining a cover comprising an enclosure having a panel formed with an opening, first means on said panel for retaining a first end of the cover on said panel at a first end of said opening, second means located at a second end of said opening opposite said first end at a position spaced laterally of said opening, said second means being slidable in a direction parallel to said opening from a first position retaining a second end of the cover on said panel to cover said opening to a second position remote from said second end of said cover, said panel being formed with a second opening adjacent said first-mentioned opening, said second means having a blanking portion closing said second opening when said second means is in first position.

2. In combination, an enclosure panel formed with an opening having a first opening end and a second opening end, a cover shaped to close said opening having a first cover end and a second cover end, first means adjacent said first opening end for securing a first cover end to said panel, second means slidable in a direction parallel to said opening between a first position adjacent said second opening end to retain said second cover end to said panel and a second position remote from said second cover end, said second means being located at said second opening end and extending laterally away from said opening, said panel being formed with a second opening adjacent said first-mentioned opening, said second means having a blanking portion closing said second opening when said second means is in first position.

3. The combination of claim 2 which further comprises a PCI card, said card being secured to said cover.

4. The combination of claim 2 which further comprises a tab extending approximately perpendicular to said cover.

5. The combination of claim 4 in which said tab extends out through said second opening and a lateral edge of said card is vicinal said panel.

6. The combination of claim 2 which further comprises a retainer having a track fixed to said panel and a slide movable along said track, said slide comprising said second means.

7. The combination of claim 6 which further comprises detent means for detachably securing said second means in first position.

8. The combination of claim 6 which further comprises a finger on said slide extending through said second opening and engaging said panel when said second means is in first position.

9. The combination of claim 6 which further comprises a finger on said slide engaging said cover when said second means is in first position.

10. The combination of claim 6 in which said slide comprises a member parallel to said panel having rail engagers engaging said track, a spring attached to said member and biased away from said panel, an arm on said spring, a grip on said arm and a detent on said arm, said detent engageable with said second opening in said panel when said second means is in first position to hold said second means in first position.

11. The combination of claim 10 in which said grip may be grasped by the user to disengage said detent from said aperture and to slide said slide along said track.

12. The combination of claim 11 which further comprises cooperating means on said arm and said member to limit disengagement of said detent from said aperture.

13. The combination of claim 2 in which said panel is formed with a third opening parallel to and below said first-mentioned opening, a second cover having a third cover end and a fourth cover end shaped to close said third opening, third means adjacent said first opening end for securing said third cover end to said panel, said second means retaining said fourth cover end to said panel when said second means is in first position.

14. The combination of claim 2 which further comprises a plate on the exterior of said panel and means interconnecting said plate and said second means.

15. A retainer for retaining a cover comprising an enclosure having a panel formed with an opening, first means on said panel for retaining a first end of the cover on said panel at a first end of said opening, second means located at a second end of said opening opposite said first end at a position spaced laterally of said opening, said second means being movable from a first position retaining a second end of the cover on said panel to cover said opening to a second position remote from said second end of said cover, said panel being formed with a second opening adjacent said first-mentioned opening, said second means having a blanking portion closing said second opening when said second means is in first position.

16. In combination, an enclosure panel formed with an opening having a first opening end and a second opening end, a cover shaped to close said opening having a first cover end and a second cover end, first means adjacent said first opening end for securing a first cover end to said panel, second means movable between a first position adjacent said second opening end to retain said second cover end to said panel and a second position remote from said second cover end, said second means being located at said second opening end and extending laterally away from said opening, said panel being formed with a second opening adjacent said first-mentioned opening, said second means having a blanking portion closing said second opening when said second means is in first position.

17. The combination of claim 16 which further comprises a PCI card, said card being secured to said cover.

18. The combination of claim 16 which further comprises a tab extending approximately perpendicular to said cover.

19. The combination of claim 18 in which said tab extends out through said second opening and a lateral edge of said card is vicinal said panel.

20. The combination of claim 16 which further comprises a retainer having a track fixed to said panel and a slide movable along said track, said slide comprising said second means.

21. The combination of claim 20 which further comprises detent means for detachably securing said second means in first position.

22. The combination of claim 20 which further comprises a finger on said slide extending through said second opening and engaging said panel when said second means is in first position.

23. The combination of claim 20 which further comprises a finger on said slide engaging said cover when said second means is in first position.

24. The combination of claim 6 in which said slide comprises a member parallel to said panel having rail engagers engaging said track, a spring attached to said member and biased away from said panel, an arm on said spring, a grip on said arm and a detent on said arm, said detent engageable with said second opening in said panel when said second means is in first position to hold said second means in first position.

25. The combination of claim 24 in which said grip may be grasped by the user to disengage said detent from said aperture and to slide said slide along said track.

26. The combination of claim 25 which further comprises cooperating means on said arm and said member to limit disengagement of said detent from said aperture.

27. The combination of claim 16 in which said panel is formed with a third opening parallel to and below said first-mentioned opening, a second cover having a third cover end and a fourth cover end shaped to close said third opening, third means adjacent said first opening end for securing said third cover end to said panel, said second means retaining said fourth cover end to said panel when said second means is in first position.

28. The combination of claim 16 which further comprises a plate on the exterior of said panel and means interconnecting said plate and said second means.

* * * * *